US005394026A

United States Patent [19]

Yu et al.

[11] Patent Number: 5,394,026

[45] Date of Patent: Feb. 28, 1995

[54] SUBSTRATE BIAS GENERATING CIRCUIT

[75] Inventors: Ruey I. Yu; Mark D. Bader, both of Austin, Tex.

[73] Assignee: Motorola Inc., Schaumburg, Ill.

[21] Appl. No.: 12,496

[22] Filed: Feb. 2, 1993

[51] Int. Cl.[6] ........ H03K 3/01

[52] U.S. Cl. ........ 327/536; 327/537; 327/539; 327/538

[58] Field of Search ........ 307/296.2, 296.4, 296.5, 307/296.8, 491, 494, 362; 330/256, 257

[56] References Cited

U.S. PATENT DOCUMENTS

| | | | |
|---|---|---|---|
| 4,142,114 | 2/1979 | Green | 307/296.2 |
| 4,293,782 | 10/1981 | Tanaka et al. | 307/350 |
| 4,338,527 | 7/1982 | Nagano | 330/257 |
| 4,438,346 | 3/1984 | Chuang et al. | 307/297 |
| 4,439,692 | 3/1984 | Beekmans et al. | 307/297 |
| 4,695,746 | 9/1987 | Tobita | 307/297 |
| 4,701,637 | 10/1987 | Piro | 307/297 |
| 4,733,108 | 3/1988 | Truong | 307/296 |
| 4,754,168 | 6/1988 | Liran | 307/296 |
| 4,794,278 | 12/1988 | Vajdic | 307/297 |
| 4,812,680 | 3/1989 | Kawashima et al. | 307/362 |
| 4,873,458 | 10/1989 | Yoshida | 307/362 |
| 5,047,670 | 9/1991 | Tran | 307/491 |
| 5,113,088 | 5/1992 | Yamamoto et al. | 307/296 |
| 5,120,993 | 6/1992 | Tsay et al. | 307/296 |
| 5,120,993 | 6/1992 | Tsay et al. | 307/296 |
| 5,122,680 | 6/1992 | Stakely et al. | 307/354 |
| 5,124,666 | 6/1992 | Liu et al. | 330/257 |
| 5,166,560 | 11/1992 | Liu | 307/355 |
| 5,202,587 | 4/1993 | McLaury | 307/296.2 |
| 5,227,675 | 7/1993 | Taguchi | 307/296.2 |
| 5,231,316 | 7/1993 | Thelen, Jr. | 307/491 |
| 5,235,222 | 8/1993 | Kondoh et al. | 307/296.8 |
| 5,264,808 | 11/1993 | Tanaka | 307/296.2 |
| 5,270,584 | 12/1993 | Koshikawa et al. | 307/296.2 |

*Primary Examiner*—Timothy P. Callahan
*Assistant Examiner*—T. Lam
*Attorney, Agent, or Firm*—Daniel D. Hill

[57] ABSTRACT

A substrate bias generating circuit (20) provides a substrate bias voltage to a substrate (50) of an integrated circuit. A voltage-to-current converter circuit (22) provides a constant current proportional to a bandgap generated reference voltage. P-channel transistors (34 and 35) then provide constant current sources for a voltage level sensing circuit (36) based on the bandgap generated reference voltage. The voltage level sensing circuit (36) monitors the level of the substrate bias voltage, and when the substrate bias voltage reaches a predetermined voltage level, provides a first control signal for activating an oscillator (47). A level converter (43) is provided to amplify, or level convert the first control signal for more reliable control of the oscillator. A substrate bias generating circuit (20) provides a precisely controlled substrate bias voltage to the substrate (50) that is independent of process, temperature, and power supply variations.

15 Claims, 1 Drawing Sheet

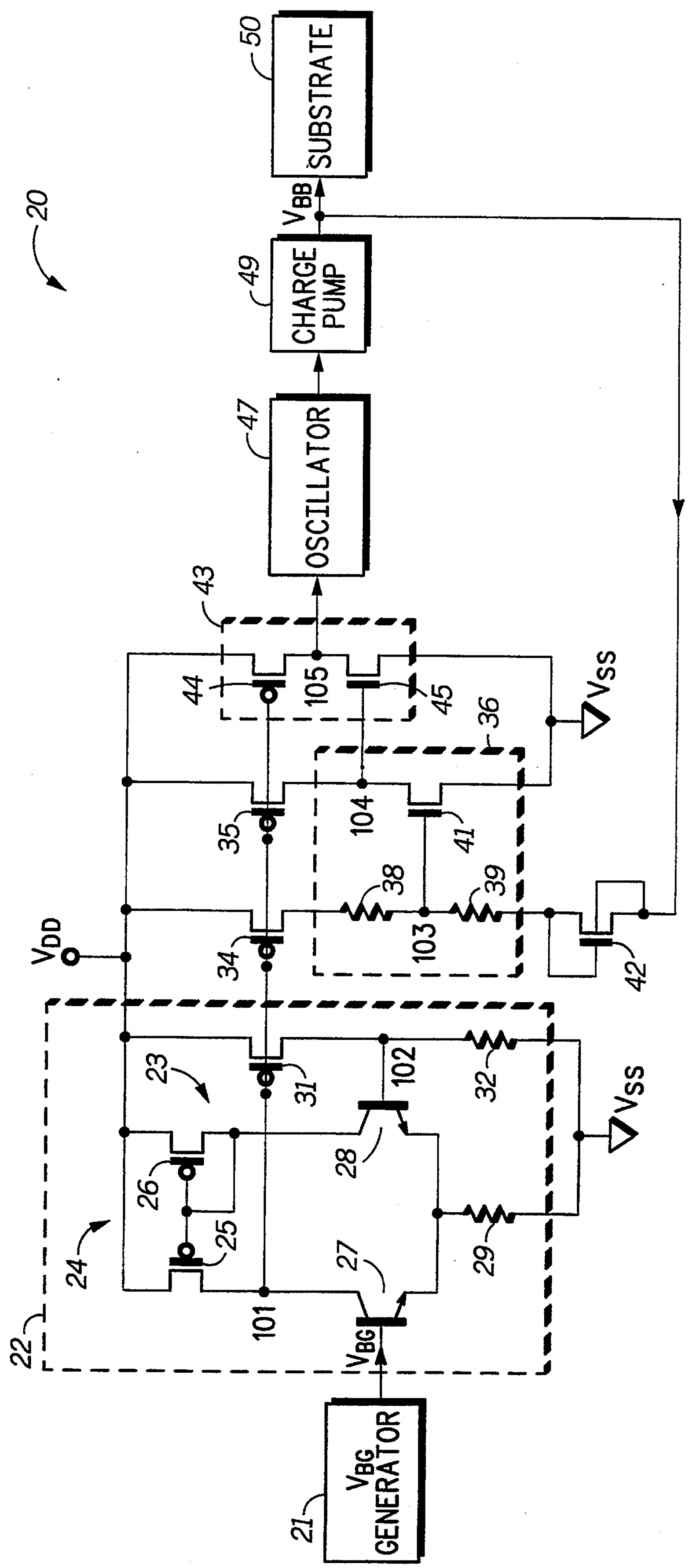
FIGURE

SUBSTRATE BIAS GENERATING CIRCUIT

FIELD OF THE INVENTION

This invention relates generally to integrated circuits, and more particularly to a circuit for generating a substrate bias voltage for an integrated circuit.

BACKGROUND OF THE INVENTION

In the design of integrated circuits having MOS (metal-oxide semiconductor) transistors, it is sometimes important to provide a stable bias voltage to a substrate of the integrated circuit. One reason to provide a bias voltage is to prevent local coupling that may inadvertantly forward bias PN junctions on the integrated circuit. Another reason to provide a bias voltage to the substrate of an integrated circuit is to control the threshold voltage ($V_T$) of the MOS transistors. The $V_T$ of a MOS transistor is the minimum gate voltage required to form a conductive channel between the source and drain regions. The $V_T$ of a MOS transistor may be varied to improve performance of an integrated circuit. As integrated circuits having MOS transistors are required to operate at lower power supply voltages it becomes more important to be able to control $V_T$ accurately. Also, as the size of the MOS transistors are reduced (below about 0.5 micron), in an effort to increase density, the $V_T$ becomes very sensitive to changes in the substrate bias voltage.

A typical substrate bias circuit includes a level detection circuit, an oscillator, and a charge pump. The level detection circuit monitors the level of the substrate bias voltage and provides a control signal to activate or deactivate the oscillator. When activated, the oscillator provides timing signals to control the output of the charge pump. The output of the charge pump is fed back to the level detector to control the level of the substrate bias voltage.

However, the typical level detection circuit does not provide the accuracy needed in order to precisely control and stabilize $V_T$ when the MOS transistors are scaled down. Also, temperature and process variations can change the operating characteristics of integrated circuits, and can produce wide variations in MOS transistor performance. In addition, variations in the power supply voltage can affect the output of the substrate bias circuit, making it more difficult to provide a stable substrate bias voltage.

SUMMARY OF THE INVENTION

Accordingly, there is provided, in one form, a substrate bias generating circuit for providing a substrate bias voltage. The substrate bias generating circuit includes a first current source, a voltage level sensing circuit, an oscillator, and a charge pump. The first current source has a first terminal coupled to a first power supply voltage terminal, and a second terminal. The second terminal provides a first substantially constant current proportional to a reference voltage. The voltage level sensing circuit has a first resistor, and senses when a magnitude of the substrate bias voltage decreases below a predetermined voltage drop across the first resistor. In response, the voltage level sensing circuit provides a first control signal. The oscillator is coupled to the voltage level sensing circuit, and produces a series of pulses at a predetermined frequency in response to the first control signal. The charge pump has an input node coupled to the oscillator for receiving the series of pulses, and an output node for providing the substrate bias voltage in response to the series of pulses. These and other features and advantages will be more clearly understood from the following detailed description taken in conjunction with the accompanying drawings.

BRIEF DESCRIPTION OF THE DRAWINGS

The sole FIGURE illustrates in partial schematic diagram form and partial block diagram form a substrate bias generating circuit in accordance with the present invention.

DESCRIPTION OF A PREFERRED EMBODIMENT

The sole FIGURE illustrates in partial schematic diagram form and partial block diagram form substrate bias generating circuit 20 in accordance with the present invention. Substrate bias generating circuit 20 includes voltage-to-current converter circuit 22, P-channel transistors 34 and 35, voltage level sensing circuit 36, N-channel transistor 42, level converter circuit 43, oscillator 47, and charge pump 49.

Voltage-to-current converter circuit 22 includes differential amplifier 23, P-channel transistor 31, and resistor 32. Differential amplifier 23 includes current mirror 24, bipolar NPN transistors 27 and 28, and resistor 29. Current mirror 24 includes P-channel transistors 25 and 26. P-channel transistor 25 has a source connected to a first power supply voltage terminal labeled "$V_{DD}$", a gate, and a drain connected to node 101. P-channel transistor 26 has a source connected to $V_{DD}$, and a gate and a drain connected to the gate of P-channel transistor 25. Bipolar transistor 27 has a collector connected to the drain of P-channel transistor 25 at node 101, a base connected to an output terminal of bandgap voltage generating circuit 21, for receiving a bandgap generated reference voltage labeled "$V_{BG}$", and an emitter. Bipolar NPN transistor 28 has a collector connected to the drain of P-channel transistor 26, a base connected to node 102, and an emitter connected to the emitter of NPN transistor 27. Resistor 29 has a first terminal connected to the emitters of NPN transistors 27 and 28, and a second terminal connected to a second power supply voltage terminal labeled "$V_{SS}$". P-channel transistor 31 has a source connected to $V_{DD}$, a gate connected to the drain of P-channel transistor 25 at node 101, and a drain connected to the base of NPN transistor 28 at node 102. Resistor 32 has a first terminal connected to the drain of P-channel transistor 31 at node 102, and a second terminal connected to $V_{SS}$.

P-channel transistor 34 has a source connected to $V_{DD}$, a gate connected to the gate of P-channel transistor 31, and a drain. P-channel transistor 35 has a source connected to $V_{DD}$, a gate connected to the gate of P-channel transistor 31, and a drain connected to node 104. P-channel transistor 34 and 35 are constant current sources for providing a relatively constant current to voltage level sensing circuit 36.

Voltage level sensing circuit 36 includes resistors 38 and 39, and N-channel transistor 41. Resistor 38 has a first terminal connected to the drain of P-channel transistor 34, and a second terminal connected to node 103. Resistor 39 has a first terminal connected to the second terminal of resistor 38 at node 103, and a second terminal. N-channel transistor 41 has a drain connected to the drain of P-channel transistor 35 at node 104, a gate connected to the second terminal of resistor 38 at node 103, and a source connected to $V_{SS}$. Node 104 is an output node of voltage level sensing circuit 36 for providing a first control signal. Diode-connected N-channel transistor 42 has a gate and a drain connected to the second terminal of resistor 39, and a source and a substrate terminal for receiving a substrate bias voltage labeled "$V_{BB}$".

Level converter circuit 43 includes P-channel transistor 44 and N-channel transistor 45. P-channel transistor 44 has a source connected to $V_{DD}$, a gate connected the gate of P-channel transistor 31, and a drain connected to node 105. N-channel transistor 45 has a drain connected to the drain of P-channel transistor 44 at node 105, a gate connected to the drain of N-channel transistor 41 at node 104, and a source connected to $V_{SS}$. Node 105 is an output node of level converter 43 for providing a second control signal. Note that all of the N-channel transistors and P-channel transistors are MOS transistors and have their substrate terminals connected to $V_{SS}$, except for N-channel transistor 42, which has its substrate terminal coupled to its source for receiving substrate bias voltage $V_{BB}$.

Oscillator 47 has an input terminal connected to the drain of P-channel transistor 44 at node 105, and an output terminal. Charge pump 49 has an input terminal connected to the output terminal of oscillator 47, and an output terminal for providing substrate bias voltage $V_{BB}$ to semiconductor substrate 50.

In the preferred embodiment, substrate bias generating circuit 20 provides a precisely controlled substrate bias voltage $V_{BB}$ to an isolated P− well in an SRAM (not shown) that has a triple well structure. In a triple well structure, the memory cell array is contained in a P- well. Only the P- substrate well housing the cell array is biased in order to avoid affecting the operation of peripheral circuits housed in other wells. The triple well structure is used because it provides increased immunity to soft error caused by alpha particle emissions.

In operation, substrate bias voltage $V_{BB}$ is provided at the output terminal of charge pump 49. Voltage level sensing circuit 36 monitors the voltage level of substrate bias voltage $V_{BB}$ and provides the first control signal at node 104 to activate or deactivate oscillator 47. When the voltage at node 103 rises above the threshold voltage of N-channel transistor 41, indicating that substrate bias voltage $V_{BB}$ has risen above the predetermined voltage level, N-channel transistor 41 is conductive, which causes oscillator 47 to be activated. When the voltage at node 103 is below $V_T$, indicating that substrate bias voltage $V_{BB}$ is below the predetermined voltage level, N-channel transistor 41 substantially nonconductive, which causes oscillator 47 to be deactivated. Oscillator 47 is a conventional ring oscillator for providing a clock signal to charge pump 49 at a predetermined frequency. Charge pump 49 is a conventional charge pump for "pumping down" the voltage level of P- substrate well 50. P- substrate well 50 is pumped down to a predetermined voltage level below the lower power supply voltage (usually a negative voltage). The amount P− substrate well 50 is pumped down may be adjusted, depending on the particular application.

When voltage level sensing circuit 36 senses, or detects that substrate bias voltage $V_{BB}$ has increased above the predetermined voltage level, the voltage at node 103 becomes high enough to make N-channel transistor 41 conductive. The first control signal at node 104 becomes a low voltage, causing N-channel transistor 45 to be substantially non-conductive. The second control signal at node 105 is therefore a logic high, thus activating oscillator 47. Level converter 43 level converts, or amplifies the analog voltage levels of the first control signal to logic levels with sufficient voltage swing to reliably activate and deactivate oscillator 47. When activated, oscillator 47 provides a clock signal to activate charge pump 49. Charge pump 49 provides substrate bias voltage $V_{BB}$ to P− substrate 50. When substrate bias voltage $V_{BB}$ is reduced to the predetermined voltage level, voltage level sensing circuit 36 provides the first control signal as a high voltage at node 104, which is provided to the gate of N-channel transistor 45. N-channel transistor 45 becomes conductive, causing the second control signal at node 105 to become a logic low to deactivate oscillator 47, which in turn deactivates charge pump 49.

$V_{BG}$ generator 21 is a conventional bandgap voltage generator circuit. A conventional bandgap voltage generator uses the bandgap voltage of silicon to provide a stable reference voltage. For this application, bandgap voltage is equal to about 1.26 volts and is independent of the power supply voltage.

Voltage-to-current converter circuit 22 generates an output current proportional to bandgap generated reference voltage $V_{BG}$. Bandgap generated reference voltage $V_{BG}$ is provided to the base of NPN transistor 27 of voltage-to-current converter circuit 22, causing a collector current designated as $I_{27}$ to flow through NPN transistor 27. This current is "mirrored" by current mirror 24, causing a collector current designated as $I_{28}$ to flow through NPN transistor 28. P-channel transistor 31 receives a gate voltage from the collector of transistor 27 at node 101. Node 101 is an output node of differential amplifier 23. P-channel transistor 31 and resistor 32 complete a feedback path from the collector of NPN transistor 27 at node 101 to the base of NPN transistor 28, causing node 102 to follow the voltage variations at the base of NPN transistor 27. Therefore, the voltage at node 102 is approximately equal to bandgap reference voltage $V_{BG}$. Current $I_{27}$ is equal to current $I_{28}$ if the sizes of NPN transistors 27 and 28 are the same and current mirror 24 is symmetrical. Assuming NPN transistor 28 has negligible base current, a drain current through P-channel transistor 31, designated as $I_{31}$, is equal to approximately $V_{BG}$ divided by $R_{32}$, where $R_{32}$ is the resistance of resistor 32. Since bandgap generated reference voltage $V_{BG}$ is constant, current $I_{31}$ is relatively constant assuming $R_{32}$ is constant. Therefore, P-channel transistor 31 provides a relatively constant current source based on bandgap generated reference voltage $V_{BG}$.

A first current, designated as $I_{34}$, through P-channel transistor 34 mirrors current $I_{31}$. Also, a second current, designated as $I_{35}$, through P-channel transistor 35 mirrors current $I_{31}$. The percentage of current mirrored by P-channel transistors 34 and 35 depends on the relative dimensions and sizes of P-channel transistors 34 and 35 to those of P-channel transistor 31. Therefore, $I_{34}=\eta I_{31}$, where $\eta$ is the percentage of current being mirrored. If $I_{31}=V_{BG}/R_{32}$, as discussed above, then $I_{34}=\eta V_{BG}/R_{32}$. Thus, P-channel transistors 34 and 35 are also relatively constant Current sources based on bandgap generated reference voltage $V_{BG}$, and are therefore independent of $V_{DD}$. N-channel transistor 44 also provides a substantially constant current source for level converter 43.

A voltage at node 103 (the gate-to-source voltage of N-channel transistor 41), designated as $V_{103}$, is equal to about $I_{34}R_{39}+V_{DS42}-|V_{BB}|$, where $R_{39}$ is the resistance of resistor 39, $V_{DS42}$ is the drain-source voltage of N-channel transistor 42, and $|V_{BB}|$ is the absolute value, or magnitude of substrate bias voltage $V_{BB}$. From the above equation for $V_{103}$, it is clear that $$|V_{BB}|=I_{34}R_{39}+V_{DS42}-V_{103}$$

N-channel transistor 42 is diode connected and compensates for temperature and process variations of N-channel transistor 41. $V_{DS42}$ is approximately equal to $V_{103}$ if N-channel transistor 42 is the same size as N-channel transistor 41 and if they are positioned at approximately the same location and orientation on the integrated circuit. If that is the case, $V_{DS42}\approx V_{103}$ and $$|V_{BB}|\approx I_{34}R_{39}$$

Since current $I_{34}$ is based on bandgap generated reference voltage $V_{BG}$, as shown above, and resistor 39 compensates for the temperature and process variations of resistor 32, then substrate bias voltage $V_{BB}$ has approximately the same accuracy and stability as bandgap generated reference voltage $V_{BG}$, and is therefore independent of the power supply voltage.

The voltage level of substrate bias voltage $V_{BB}$, may be easily adjusted by varying the value of $R_{39}$. However, the particular voltage level of substrate bias voltage $V_{BB}$ also depends on the limitations of the particular charge pump circuit used for charge pump 49.

In a preferred embodiment, $V_{DD}$ is at ground potential and $V_{SS}$ is supplied with a power supply voltage equal to approximately −5.0 volts. However, in other embodiments, $V_{DD}$ may be supplied with a positive power supply voltage with $V_{SS}$ at ground potential.

Substrate bias generating circuit 20 therefore provides the advantage of precisely controlling substrate bias voltage $V_{BB}$ that is based on bandgap generated reference voltage $V_{BG}$ and is independent of process, temperature, and power supply variations.

While the invention has been described in the context of a preferred embodiment, it will be apparent to those skilled in the art that the present invention may be modified in numerous ways and may assume many embodiments other than that specifically set out and described above. For example, even though substrate bias generating circuit 20 has been disclosed in a preferred embodiment for pumping down a P− substrate well, it may also be used anywhere a precisely controlled negative voltage is required. Accordingly, it is intended by the appended claims to cover all modifications of the invention which fall within the true spirit and scope of the invention.

What is claimed is:

1. A substrate bias generating circuit for providing a substrate bias voltage, comprising:

a voltage-to-current converter circuit having an input terminal for receiving a bandgap generated reference voltage, and in response, generating a reference current proportional to said bandgap generated reference voltage;

a first current source having a first terminal coupled to a first power supply voltage terminal, and a second terminal, said first current source for providing a first current proportional to said reference current;

a second current source having a first terminal coupled to said first power supply voltage terminal, and a second terminal, said second current source for providing a second current proportional to said reference current;

a voltage level sensing circuit, comprising:

a first resistor having a first terminal coupled to said second terminal of said first current source, and a second terminal;

a second resistor having a first terminal coupled to said second terminal of said first resistor, and a second terminal;

a first N-channel transistor having a first current electrode coupled to said second terminal of said second current source, a control electrode coupled to said second terminal of said first resistor, and a second current electrode coupled to a second power supply voltage terminal; and a second N-channel transistor having a first current electrode coupled to said second terminal of said second resistor, a control electrode coupled to said second terminal of said second resistor, and a second current electrode for receiving said substrate bias voltage said second N-channel transistor for compensating for temperature and process variations of said first N-channel transistor;

an oscillator having an input terminal coupled to said voltage level sensing circuit, and an output terminal for producing a series of pulses at a predetermined frequency; and a charge pump having an input terminal coupled said output terminal of said oscillator, for receiving said series of pulses, and for providing said substrate bias voltage.

2. The substrate bias generating circuit of claim 1, wherein said voltage-to-current converter circuit comprises:

a differential amplifier having first and second bipolar transistors and a current mirror, a base of said first bipolar transistor for receiving said bandgap generated reference voltage;

a first P-channel transistor having a first current electrode coupled to said first power supply voltage terminal, a control electrode coupled to a collector of said first bipolar transistor, and a second current electrode; and a third resistor having a first terminal coupled to said second current electrode of said first P-channel transistor, and a second terminal coupled to said second power supply voltage terminal.

3. The substrate bias generating circuit of claim 2, further comprising a level converter circuit, said level converter circuit comprising:

a second P-channel transistor having a first current electrode coupled to said first power supply voltage terminal, a control electrode coupled to said control electrode of said first P-channel transistor, and a second current electrode; and a third N-channel transistor having a first current electrode coupled to said second current electrode of said second P-channel transistor, a control electrode coupled to said second terminal of said second current source, and a second current electrode coupled to said second power supply voltage terminal.

4. The substrate bias generating circuit of claim 1, wherein said first and second current sources are characterized as being P-channel transistors.

5. The substrate bias generating circuit of claim 1, wherein said first power supply voltage terminal is for receiving a first power supply voltage and said second power supply voltage terminal is for receiving a second power supply voltage, said substrate bias voltage is provided at a predetermined voltage level below said second power supply voltage.

6. The substrate bias generating circuit of claim 1, wherein said oscillator is a ring oscillator.

7. A substrate bias generating circuit, comprising:

a voltage-to-current converter, comprising:

a differential amplifier having first and second bipolar transistors and a current mirror, a collector of each of the first and second bipolar transistors coupled to the current mirror, and emitters of the first and second bipolar transistors coupled together, a base of said first bipolar transistor for receiving a bandgap generated reference voltage;

a first P-channel transistor having a first current electrode coupled to a first power supply voltage terminal, a control electrode coupled to a collector of said first bipolar transistor, and a second current electrode coupled to a base of the second bipolar transistor, said first P-channel transistor providing a first current; and a first resistor having a first terminal coupled to said second current electrode of said first P-channel transistor, and a second terminal coupled to a second power supply voltage terminal;

a second P-channel transistor having a first current electrode coupled to said first power supply voltage terminal, a control electrode coupled to said control electrode of said first P-channel transistor, and a second current electrode, said second P-channel transistor providing a second current;

a third P-channel transistor having a first current electrode coupled to said first power supply voltage terminal, a control electrode coupled to said control electrode of said first P-channel transistor, and a second current electrode;

a voltage level sensing circuit, comprising:

a second resistor having a first terminal coupled to said second current electrode of said second P-channel transistor, and a second terminal;

a third resistor having a first terminal coupled to said second terminal of said second resistor, and a second terminal, a first voltage drop across said third resistor is directly proportional to a second voltage drop across said first resistor for compensating for temperature and process variations of said first resistor; and a first N-channel transistor having a first current electrode coupled to said second current electrode of said third P-channel transistor, a control electrode coupled to said second terminal of said second resistor, and a second current electrode coupled to a second power supply voltage terminal;

a second N-channel transistor having a first current electrode coupled to said second terminal of said third resistor, a control electrode coupled to said second terminal of said third resistor, and a second current electrode for receiving a substrate bias voltage, said second N-channel transistor for compensating for temperature and process variations of said first N-channel transistor;

an oscillator having an input terminal coupled to said first current electrode of said first N-channel transistor, and an output terminal, said oscillator for producing a series of pulses at a predetermined frequency; and a charge pump having an input terminal coupled to said output terminal of said oscillator for receiving said series of pulses, and an output terminal for providing said substrate bias voltage.

8. The substrate bias generating circuit of claim 7, wherein said oscillator is a ring oscillator.

9. The substrate bias generating circuit of claim 7, wherein said first power supply voltage terminal is for receiving a first power supply voltage and said second power supply voltage terminal is for receiving a second power supply voltage, said substrate bias voltage is provided at a predetermined voltage level below said second power supply voltage.

10. The substrate bias generator of claim 7, further comprising a level converter circuit, said level converter circuit comprising:

a fourth P-channel transistor having a first current electrode coupled to said first power supply voltage terminal, a control electrode coupled to said control electrode of said first P-channel transistor, and a second current electrode; and a third N-channel transistor having a first current electrode coupled to said second current electrode of said fourth P-channel transistor, a control electrode coupled to said second current electrode of said third P-channel transistor, and a second current electrode coupled to said second power supply voltage terminal.

11. A substrate bias generating circuit for providing a substrate bias voltage, comprising:

a differential amplifier having a first input terminal for receiving a reference voltage, a second input terminal, and an output terminal;

a first current source having a first terminal coupled to a first power supply voltage terminal, a control terminal coupled to said output terminal of said differential amplifier, and a second terminal coupled to said second input terminal of said differential amplifier, said first current source for providing a first current;

a second current source having a first terminal coupled to said first power supply voltage terminal, a control terminal coupled to said output terminal of said differential amplifier, and a second terminal for providing a second current;

a first resistor having a first terminal coupled to said second terminal of said first current source for receiving said first current, and a second terminal coupled to a second power supply voltage terminal;

a second resistor having a first terminal coupled to said second terminal of said second current source, and a second terminal;

a third resistor having a first terminal coupled to said second terminal of said second resistor, and a second terminal, said third resistor for receiving said second current, and compensating for temperature and process variations of said first resistor;

a first MOS transistor having a first current electrode and a control electrode both coupled to said second terminal of said third resistor, and a second current electrode for receiving said substrate bias voltage;

a third current source having a first terminal coupled to said first power supply voltage terminal, a control terminal coupled to said output terminal of said differential amplifier, and a second terminal for providing a third current;

a second MOS transistor having a first current electrode coupled to said second terminal of said third current source, a control electrode coupled to said second terminal of said second resistor, and a second current electrode coupled to said second power supply voltage terminal, said second MOS transistor for compensating for temperature and process variations of said first MOS transistor;

an oscillator having an input terminal coupled to said first current electrode of said fourth MOS transistor, and an output terminal, said oscillator for producing a series of pulses at a predetermined frequency; and a charge pump having an input terminal coupled to said output terminal of said oscillator for receiving said series of pulses, and an output terminal for providing said substrate bias voltage.

12. The substrate bias generating circuit of claim 11, wherein said reference voltage is a bandgap generated reference voltage.

13. The substrate bias generating circuit of claim 11, wherein said first, second, and third current sources are P-channel transistors.

14. The substrate bias generating circuit of claim 11, wherein said differential amplifier comprises:

a first P-channel transistor having a source coupled to said first power supply voltage terminal, a gate, and a drain;

a second P-channel transistor having a source coupled to said first power supply voltage terminal, a gate coupled to said gate of said first P-channel transistor, and a drain;

a first NPN transistor having a collector coupled to said drain of said first P-channel transistor, a base for receiving said reference voltage, and an emitter; and a second NPN transistor having a collector coupled to said drain of said second P-channel transistor, a base coupled to said second terminal of said first current source, and an emitter coupled to said emitter of said first bipolar transistor.

15. The substrate bias generating circuit of claim 11, further comprising:

a fourth current source having a first terminal coupled to said first power supply voltage terminal, a control terminal coupled to said output terminal of said differential amplifier, and a second terminal; and a third MOS transistor having a first current electrode coupled to said second terminal of said fourth current source, a control electrode coupled to said first current electrode of said second MOS transistor, and a second current electrode coupled to said second power supply voltage terminal.

* * * * *

UNITED STATES PATENT AND TRADEMARK OFFICE

CERTIFICATE OF CORRECTION

PATENT NO. : 5,394,026

DATED : Feb. 28, 1995

INVENTOR(S) : Ruey I. Yu, et al

It is certified that error appears in the above-indentified patent and that said Letters Patent is hereby corrected as shown below:

In Claim 10, Column 8, Line 21,
after "bias" replace "generator" with --generating circuit--.

Signed and Sealed this

Eighteenth Day of July, 1995

*Attest:*

Bruce Lehman

BRUCE LEHMAN

*Attesting Officer*

*Commissioner of Patents and Trademarks*